(12) United States Patent
Atwood et al.

(10) Patent No.: US 8,405,419 B1
(45) Date of Patent: Mar. 26, 2013

(54) DIGITAL TEST SYSTEM AND METHOD FOR VALUE BASED DATA

(75) Inventors: Eugene Rogers Atwood, Poughkeepsie, NY (US); Thomas Joseph Bardsley, Hopewell Junction, NY (US); Victor Moy, Hopewell Junction, NY (US); Michael Won, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/233,374

(22) Filed: Sep. 15, 2011

(51) Int. Cl.
*H03K 19/173* (2006.01)
*H03K 19/00* (2006.01)
(52) U.S. Cl. ............................ 326/38; 326/16
(58) Field of Classification Search ............. 326/16, 326/38, 36; 714/724, 726
See application file for complete search history.

(56) References Cited

U.S. PATENT DOCUMENTS 6,029,240 A * 2/2000 Blaner et al. .................. 712/23
6,959,409 B2 10/2005 AbdEl-Wahid
7,076,706 B2 7/2006 Eckelman et al.

FOREIGN PATENT DOCUMENTS

| EP | 0206287 A2 | 12/1986 |
|---|---|---|
| EP | 0351742 A2 | 1/1990 |
| EP | 0472818 A3 | 4/1992 |
| EP | 0489511 A2 | 10/1992 |
| EP | 0586834 A3 | 12/1997 |
| JP | 11202026 A2 | 7/1999 |

OTHER PUBLICATIONS

Xiaojun, Ma et al.; Boundary-Scan Test Circuit Designed for FPGA; IEEE, pp. 1190-1193.

* cited by examiner

*Primary Examiner* — Don Le
(74) *Attorney, Agent, or Firm* — Ian D Mackinnon; Howard M Cohn

(57) ABSTRACT

Embodiments of the present invention provide an inequality indication system (IIS). The IIS provides built in test support which enables evaluation, in an on-chip digital logic circuit, of digital values as inequalities, with either a single pass/fail bit expressed on a device I/O or a readable register containing inequality evaluation results. The IIS enables the movement of value evaluation onto the device (chip) using a common simple method, well suited to address/data type structures or scan based structures, instead of off-chip, which then requires tester dependent custom code. The IIS, when enabled, overrides the TDO signal to allow it to function as an inequality indicator instead of a standard test data out signal.

19 Claims, 7 Drawing Sheets

| INEQ<0> | INEQ<1> | INEQ<2> | FUNCTION |
|---|---|---|---|
| 1 | 0 | 0 | LLIM < TDR < HLIM |
| 1 | 0 | 1 | TDR = HLIM |
| 1 | 1 | 0 | HLIM > TDR |
| 1 | 1 | 1 | LLIM < TDR |
| 0 | X | X | INACTIVE |

FIG. 2

DIGITAL TEST SYSTEM AND METHOD FOR VALUE BASED DATA

FIELD OF THE INVENTION

The present invention relates generally to integrated circuits, and, more particularly, to the testing of integrated circuits.

BACKGROUND OF THE INVENTION

As integrated circuits are produced with greater and greater levels of circuit density, improved testing methodologies have become necessary. One such methodology, which implements boundary scan testing of external or internal chip networks, has become to be in general use in the industry. The most common method is elaborated in the IEEE standard 1149.1, defines a TAP (Test Access Port) to implement a set of test functions, providing test access at chip level as well as at the printed circuit board (PBC) level. While boundary scan testing is prevalent, limitations still exist. In particular, evaluation of digitally encoded values (binary/signed or two's complement) where such values are not known a-priori, presents challenges in an Automatic Test Equipment (ATE) test environment where digitally based tests are completely deterministic. It is therefore desirable to have an improved system and method for integrated circuit testing to address the aforementioned shortcomings.

SUMMARY

In one embodiment of the present invention, a logic circuit is provided. The logic circuit comprises an inequality register, a lower limit register, an upper limit register, a test data register, a test data out signal, a greater-than-or-equal compare logic block, a less-than compare logic block, wherein the inequality register comprises a plurality of bits that when programmed, enable an inequality evaluation comparing data in the test data register with data in the upper limit register and the lower limit register, and wherein the logic circuit is configured and disposed to cause the test data out signal to be asserted when data in the test data register satisfies an inequality condition.

In another embodiment of the present invention, an integrated circuit chip is provided. The integrated circuit chip comprises at least one logic core, at least one inequality indication system, and at least one test data out signal configured and disposed to output the results of the at least one inequality indication system. In another embodiment of the present invention, a method is provided for evaluating an inequality in a digital logic circuit. The method comprises programming an inequality register, programming an upper limit register, programming a lower limit register, and programming a value to be compared in a test data register.

BRIEF DESCRIPTION OF THE DRAWINGS

The structure, operation, and advantages of the present invention will become further apparent upon consideration of the following description taken in conjunction with the accompanying figures (FIGs.). The figures are intended to be illustrative, not limiting.

Certain elements in some of the figures may be omitted, or illustrated not-to-scale, for illustrative clarity. The cross-sectional views may be in the form of "slices", or "near-sighted" cross-sectional views, omitting certain background lines which would otherwise be visible in a "true" cross-sectional view, for illustrative clarity.

Often, similar elements may be referred to by similar numbers in various figures (FIGs) of the drawing, in which case typically the last two significant digits may be the same, the most significant digit being the number of the drawing figure (FIG).

FIG. 1 is a block diagram of an embodiment of the present invention.

FIG. 2 is a truth table for an embodiment of the present invention.

FIG. 3 is a register representation of an embodiment of the present invention.

FIG. 4 is a block diagram of another embodiment of the present invention.

FIG. 5 is a block diagram of another embodiment of the present invention.

FIG. 6 is a block diagram of another embodiment of the present invention.

FIG. 7 is a block diagram of another embodiment of the present invention.

FIG. 8 is a flowchart indicating process steps for an embodiment of the present invention.

FIG. 9 shows a block diagram of an exemplary design flow.

DETAILED DESCRIPTION

Embodiments of the present invention provide an inequality indication system (IIS). The IIS provides built in test support which enables evaluation, in an on-chip digital logic circuit, of digital values as inequalities, with either a single pass/fail bit expressed on a device I/O or a readable register containing inequality evaluation results. The IIS enables the movement of value evaluation onto the device (chip) using a common simple method, well suited to address/data type structures or scan based structures, instead of off-chip requiring tester dependent custom code. Embodiments of the present invention allow for arbitrary location of an MSB-to-LSB or two's complement ordered value within an address register or scan string. Embodiments of the present invention provide a greater than and less than (range checking), less than, greater than, or equality type evaluation to be performed. Such evaluations may use the entire resolution of the measurement or limit the evaluation to a set of higher (or lower) order bits. Further, the evaluation produces a quasi real-time result of the inequality comparison on one or more chip external I/O for fast pass/fail evaluation. This can enable more efficient testing, and also allows inspection of parameters that can not be predicted a priori. The following description and accompanying figures further describes embodiments of the present invention. Note that while in some examples, JTAG (IEEE 1149.1) is used, embodiments of the present invention are not limited to JTAG, and other testing schemes and boundary scan systems may be used in conjunction with embodiments of the present invention.

Figure 1:
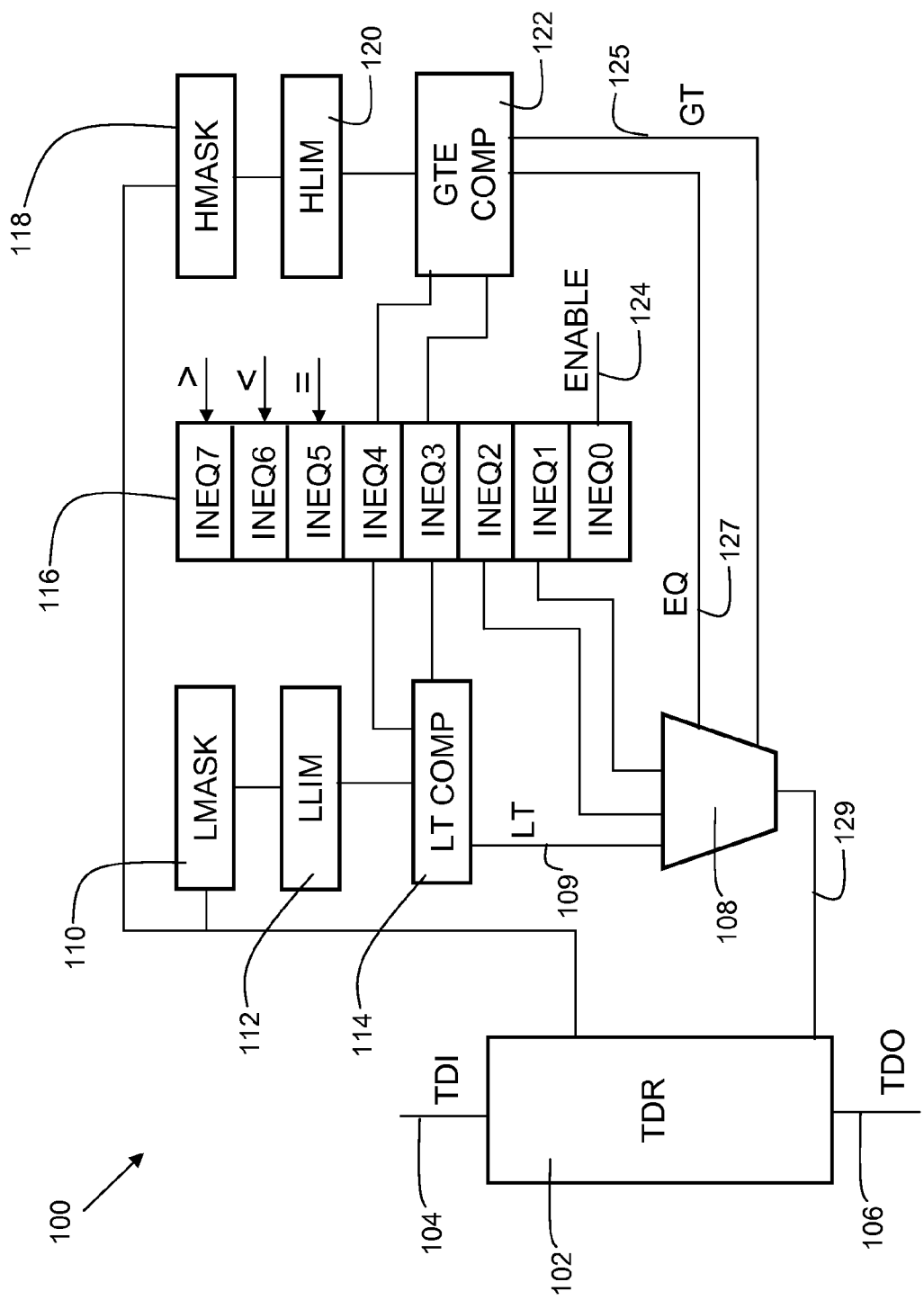

FIG. 1 is a block diagram 100 of an inequality information system (IIS) in accordance with an embodiment of the present invention. IIS 100 is a logic circuit which comprises a test data register (TDR) 102. Data is input to the TDR via the TDI signal 104, and data is output from the TDR via the TDO signal (106). TDI signal 104 is a chip input, and TDO signal 106 is a chip output. An inequality register 116 allows for programming the IIS to assert the TDO signal based on the desired inequality expression. In this embodiment, there are 8 bits in the inequality register (INEQ) 116. Other implementations may have more or less bits. A low limit register (LLIM) 112 stores a lower limit value to be used in inequality expressions. Similarly, a high limit register (HLIM) 120 stores an upper limit value to be used in inequality expressions. The LLIM register 112 can be masked via LLIM mask register (LMASK) 110. The HLIM register 120 can be masked via HLIM mask register (HMASK) 118. The LMASK and HMASK registers store mask values which allow for using only a portion of the bits in the respective LLIM and HLIM registers.

A less-than compare logic block (LT COMP) 114 asserts a LT signal 109 when a comparison between the data contained in the TDR register 102 and the data in the LLIM register 112 evaluates such that LLIM<TDR. Similarly, a greater-than-or-equal compare logic block (GTE COMP) 122 asserts a GT signal 125 when a comparison between the data contained in the TDR register 102 and the data in the HLIM register 120 evaluates such that HLIM>TDR. GTE COMP 122 asserts EQ signal 127 when a comparison between the data contained in the TDR register 102 and the data in the HLIM register 120 evaluates such that HLIM=TDR. The GTE COMP 122 and LT COMP 114 may be implemented using techniques well-known in the art.

The inequality information system is configured via the INEQ register 116. Each bit is referred to as INEQX, where X represents a particular bit location within the INEQ register. For example, INEQ0 pertains to bit 0 of the INEQ register 116, and is an activation bit for the IIS 100. INEQ0 is an input used to activate the IIS when ENABLE signal 124 is asserted. When the IIS is enabled, the result of the inequality evaluation is output on the TDO signal 106. When the IIS is disabled, the TDO signal 106 functions as a normal TDO signal for a test environment, and can clock out the contents of the TDR register. Hence, the IIS, when enabled, overrides the TDO signal to allow it to function as an inequality indicator instead of a standard test data out signal. Bits INEQ1 and INEQ2 are used to configure the type of inequality from the following options:

LLIM<TDR<HLIM
TDR=HLIM
HLIM>TDR
LLIM<TDR

The output signal LT 109 of LT COMP 114, and output signals GT 125 and EQ 127 from GTE COMP 122 are input to combining logic block 108 along with the settings of INEQ1 and INEQ2. The output 129 of combining logic block 108 is output to the TDO signal 106 (when ENABLE signal 124 is asserted).

INEQ3 and INEQ4 are used to configure the mode for the comparisons. When INEQ3 is set to 0, a binary mode is used. When INEQ3 is set to 1, a twos-complement mode is used. The INEQ4 bit indicates the TDR bits being evaluated are signed when set to 1, and unsigned when set to 0.

Bits INEQ5, INEQ6, and INEQ7 are readable bits that convey the current status of the inequality. INEQ5 is set to 1 when the EQ signal 127 is asserted, and set to 0 when the EQ signal is not asserted. INEQ6 is set to 1 when the LT signal 109 is asserted, and set to 0 when the LT signal is not asserted. INEQ7 is set to 1 when the GT signal 125 is asserted, and set to 0 when the GT signal is not asserted. In this way, the current state of an inequality evaluation can be obtained in two different ways. One way is by reading bits INEQ5-INEQ7. Another way is to monitor the state of the TDO signal 106 when the IIS is active (ENABLE 124 is asserted).

Using the TDO signal 106 to evaluate an inequality expression allows for efficient testing and is particularly well-suited for characterization applications. For example, in certain cases, analog values that may vary from device to device can be quickly checked to determine if they are in range. For example, internally, circuits may apply a current bias to the input of a latch to optimize it's sensitivity in a desired range. The current bias is established by programming a digital-to-analog-converter (DAC) register. In an embodiment of the present invention, an iterative process may be used to determine the optimal value. To quickly determine if the DAC is programmed within a specified range, the low limit register LLIM 110 and high limit register HLIM 120 are programmed with the acceptable lower and upper limits of the DAC, respectively. In this case, the value of the DAC register is placed in TDR 102 and the IIS 100 is configured to assert the TDO signal 106 when the value in TDR 102 is between the value in LLIM 112 and HLIM 120. This allows for fast testing of the DAC register to determine if it is in range. A test can be run multiple times while the TDO signal 106 is monitored to determine if the DAC register is ever set outside of acceptable limits.

Figure 2:
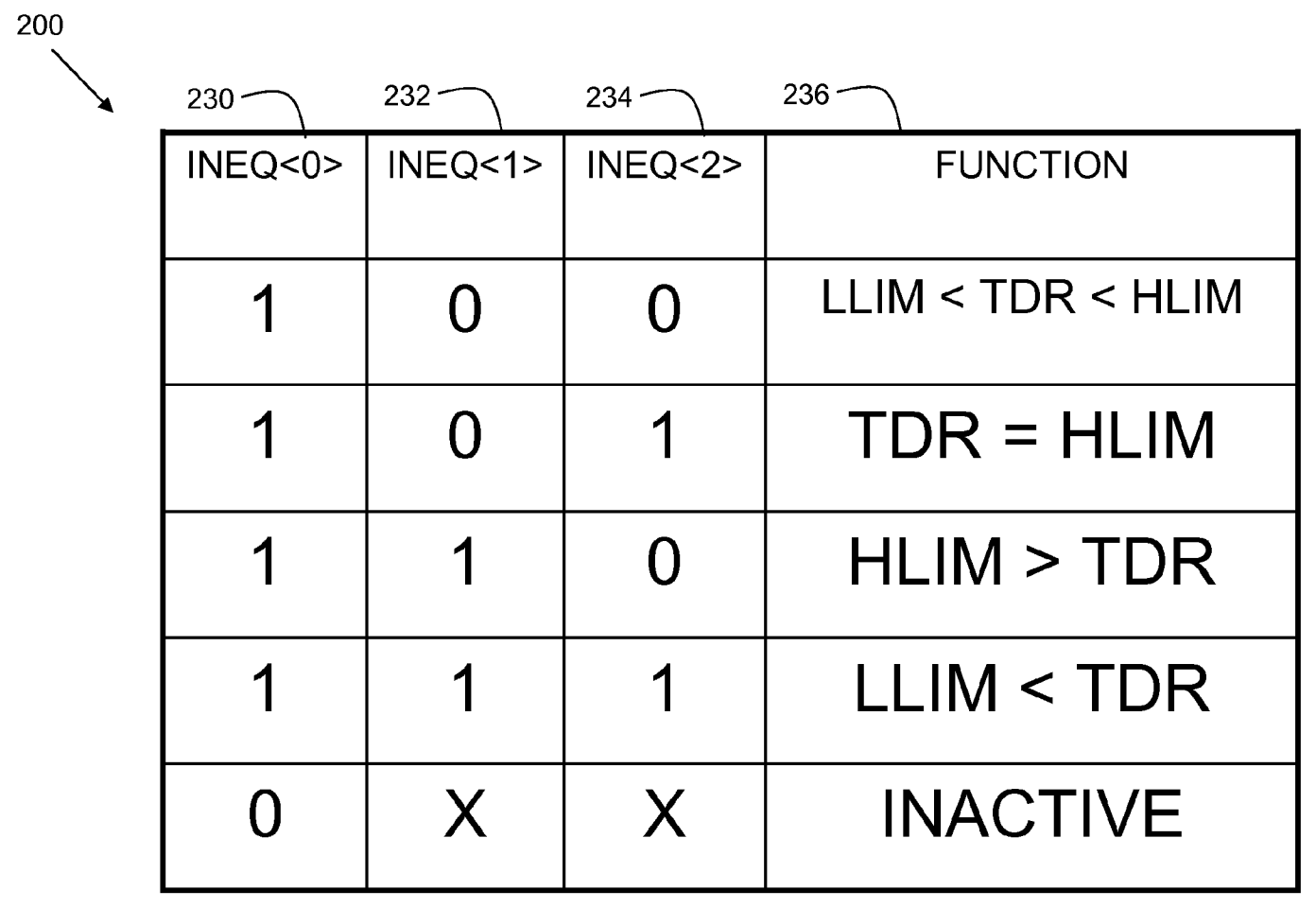

FIG. 2 is a truth table 200 for an embodiment of the present invention. Column 230 indicates the state of the INEQ0 bit of the INEQ register (see 116 of FIG. 1). Column 232 indicates the state of the INEQ1 bit of the INEQ register. Column 234 indicates the state of the INEQ2 bit of the INEQ register. Column 236 indicates corresponding comparison type as a result of the bit settings of INEQ0, INEQ1, and INEQ2.

Figure 3:
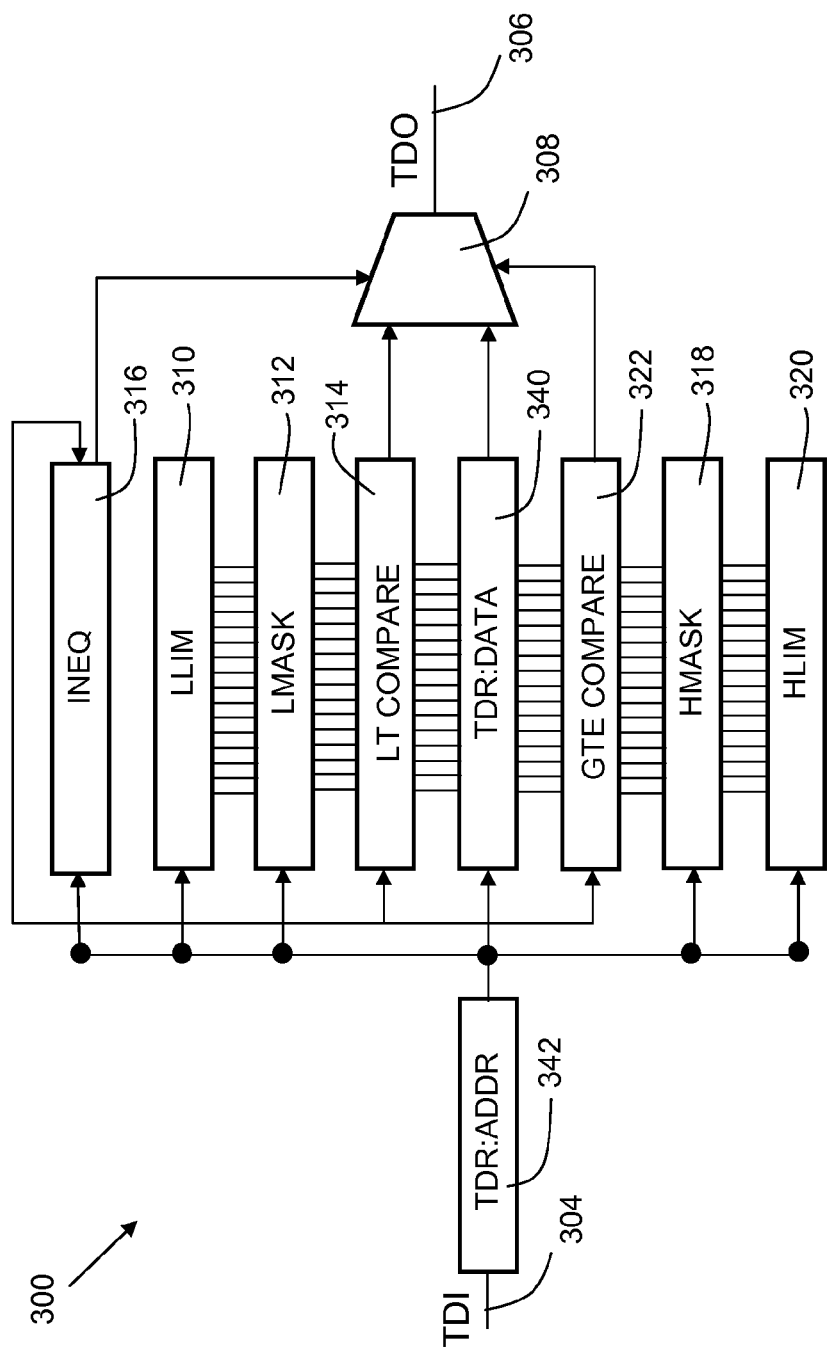

FIG. 3 is a register representation 300 of an embodiment of the present invention. In this embodiment, the addresses are all sourced from the TDR:ADDR (342). Where each address mapped register is selected via a 1149.1 mechanism in a serial manner until each is programmed to it's intended value, then the address of the digitally encoded value is selected. Once the address is established and the data becomes valid the TDO will subsequently present the result externally. The addressable registers include INEQ 316, LLIM 310, LMASK 312, HMASK 318, and HLIM 320. Data in TDR:DATA 340 is evaluated with LT COMPARE logic block 314 and GTE COMPARE logic block 322. Depending on the configuration programmed into INEQ 316, the results of the comparison signals from LT COMPARE and GTE COMPARE are fed to logic block 308, and the unified result is output on TDO 306. For example, as shown in the truth table 200 of FIG. 2, when INEQ0=1, INEQ1=0, and INEQ2=1, then TDO 306 is asserted when the value in TDR:DATA 340 is equal to the value in HLIM 320, as applied through a mask value stored in HMASK 318. The value compared in TDR:DATA 340 is established by programming a value into TDR:ADDR 342, which is an address pointing to the data retrieved when TDR:DATA 340 is compared by LT COMPARE logic block 314 and GTE COMPARE logic block 322.

Figure 4:
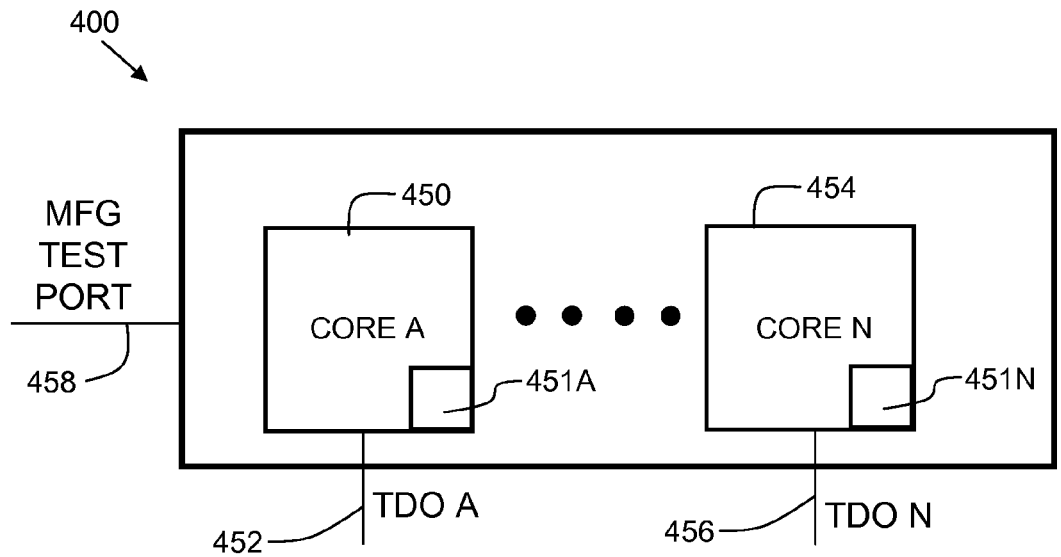

FIG. 4 is a block diagram of an integrated circuit chip 400 in accordance with another embodiment of the present invention. In this embodiment, there are multiple logic cores. Two logic cores are shown (CORE A 450 and CORE N, 454). However, more than two logic cores may be present within chip 400. Each core comprises an IIS (451A for core A, and 451N for core N) similar to that shown in FIG. 1. The TDO signal of each core is exposed externally on chip 400. A manufacturing test port 458 is used to program the IIS of each core. While some embodiments may use a JTAG port as manufacturing test port 458, embodiments of the present invention are not limited to JTAG, and other types of manufacturing test ports may be used. Each TDO signal may be read simultaneously, and each IIS within each core may be accessed simultaneously via the manufacturing test port 458. Hence, this embodiment is a broadcast write-parallel read system.

Figure 5:
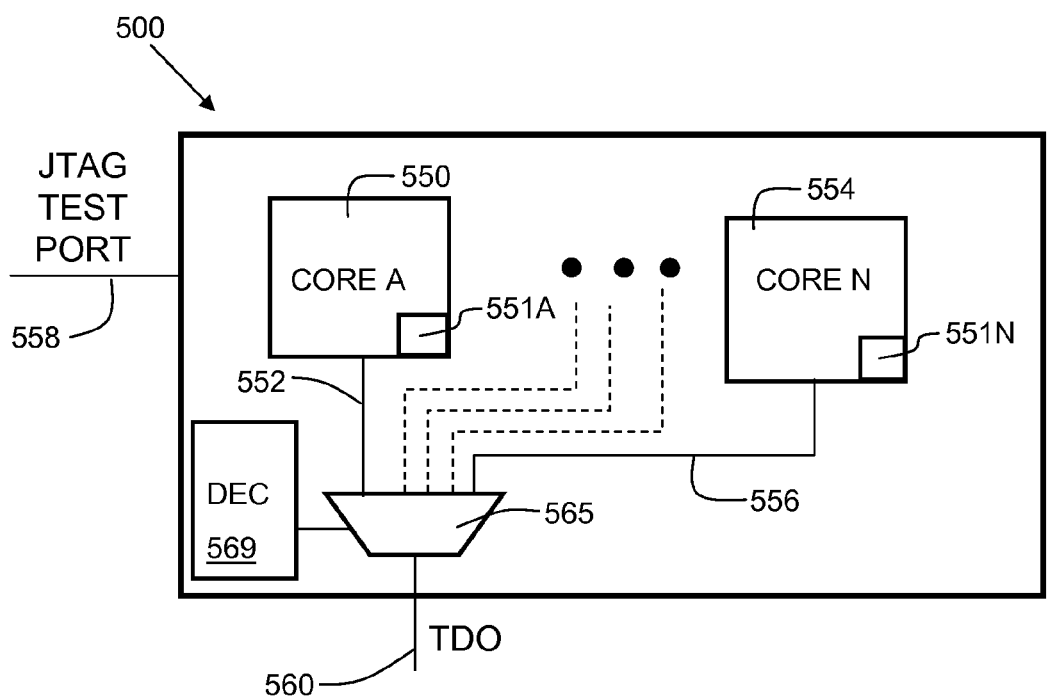

FIG. 5 is a block diagram of an integrated circuit chip 500 in accordance with another embodiment of the present invention. In this embodiment, similar to the embodiment of FIG. 4, there are multiple logic cores. Two logic cores are shown (CORE A 550 and CORE N, 554). There may be more than two cores in some embodiments. Each core comprises an IIS (551A for core A, and 551N for core N) similar to that shown in FIG. 1. However, unlike the more general embodiment shown in FIG. 4, the embodiment shown in FIG. 5 is specific to JTAG. Since JTAG allows only a single TDO line, the TDO of each core (TDO 552 for core A 550, and TDO 556 for core N 554) is fed to a combining logic module 565. Decoding logic block 569 is programmed via JTAG test port 558 so that the TDO of any given core may be read via the chip TDO 560. Hence, this embodiment is a broadcast write-individual read system, since the TDO of only one core may be read at one time.

Figure 6:
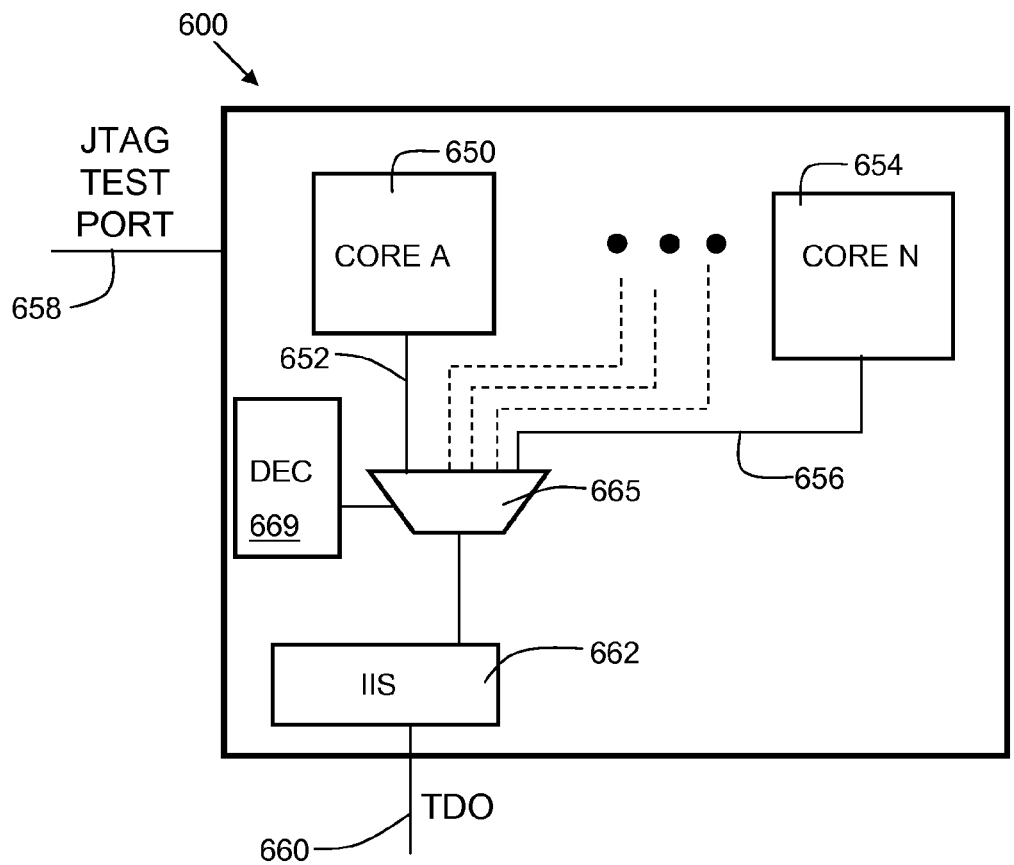

FIG. 6 is a block diagram of an integrated circuit chip 600 in accordance with another embodiment of the present invention. In this embodiment, similar to the embodiment of FIG. 4, there are multiple logic cores. Two logic cores are shown (CORE A 650 and CORE N, 654). There may be more than two cores in some embodiments. However, unlike the chip 500 shown in FIG. 5, the cores (650, 654) within chip 600 do not have an IIS module within them. This may occur in cases where a chip designer uses "off the shelf" cores for various functions that may not have an IIS integrated within the core. In this embodiment, a chip-level IIS 662 is on the chip 600. Similar to the embodiment of FIG. 5, the TDO of each core (TDO 652 for core A 650, and TDO 656 for core N 654) is fed to a combining logic module 665. However, unlike the embodiment of FIG. 5, this embodiment has an IIS 662 at the output of the combining logic module 665. Data to be compared for a particular core is clocked out to the IIS 662 and loaded in the TDR register (see 102 of FIG. 1). Decoding logic block 669 is programmed via JTAG test port 658 so that the chip TDO 660 can represent a real-time inequality result for a given core. Hence, in this embodiment, the IIS logic is not included in the cores, but rather, a common chip-level IIS 662 is shared by the multiple cores (650, 654).

Figure 7:
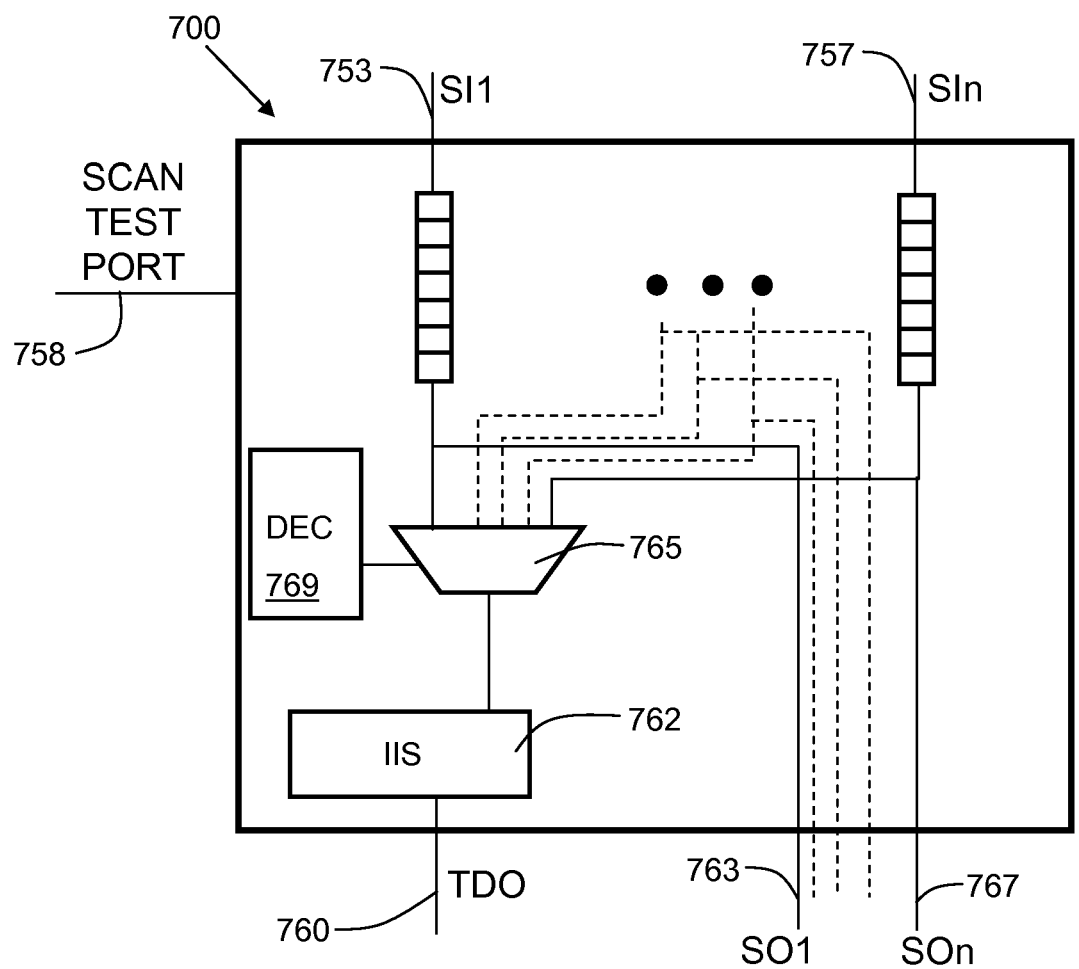

FIG. 7 is a block diagram of an integrated circuit chip 700 in accordance with another embodiment of the present invention. In this embodiment, a plurality of scan chains 753 and 757 are shown. Embodiments may have more than two scan chains. Scan chains are a combination of registers (flip-flops or latches) used to gain access to internal nodes of a chip, and their use in Design For Test (DFT) methodologies is well known. However, embodiments of the present invention employ a chip-level IIS 762 to facilitate a level of testing that previously was not possible on-chip. In one application, decoding logic block 769 is programmed via scan test port 758 so that the chip TDO 760 can represent a real-time inequality result for data encoded in a section of a given scan chain. To read desired data from the scan chain, data is clocked through on a scan chain input (e.g. SI1). When the data is clocked through to the TDR register, the inequality is checked via the IIS 762, and the result is output on chip TDO 760. Data exits the scan chain via scan chain outputs (763 and 767). Another application of this embodiment is to read data that cannot be determined a priori. For example, ambient data, such as the output of a temperature sensor may not be known ahead of time. However, such data can be input through a scan chain and then evaluated via the IIS 762 to see if it is within desired limits. For such an application, the lower and upper limits are programmed in the LLIM and HLIM registers respectively, and the INEQ register is configured according to the first row of truth table 200 in FIG. 2.

Figure 8:
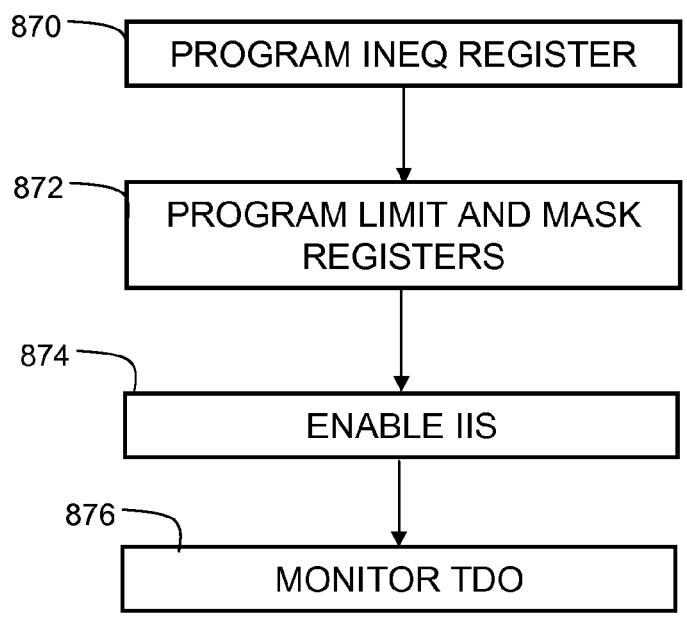

FIG. 8 is a flowchart indicating process steps for an embodiment of the present invention. Note that the steps do not necessarily need to occur in this order. This order is shown just for example purposes. In process step 870, the INEQ register is programmed for the desired test. This test is one of the tests listed in column 236 of the truth table 200 of FIG. 2. In process step 872, the lower and upper limit and mask registers are programmed. These are listed as 310, 312, 318, and 320 of FIG. 3. In process step 874, the IIS is enabled. This is done by setting the bit INEQ0 (see 124 of FIG. 1). In process step 876, the TDO signal (see 106 of FIG. 1) is monitored to detect when the comparison that was programmed in process steps 870 and 872 has occurred.

Figure 9:
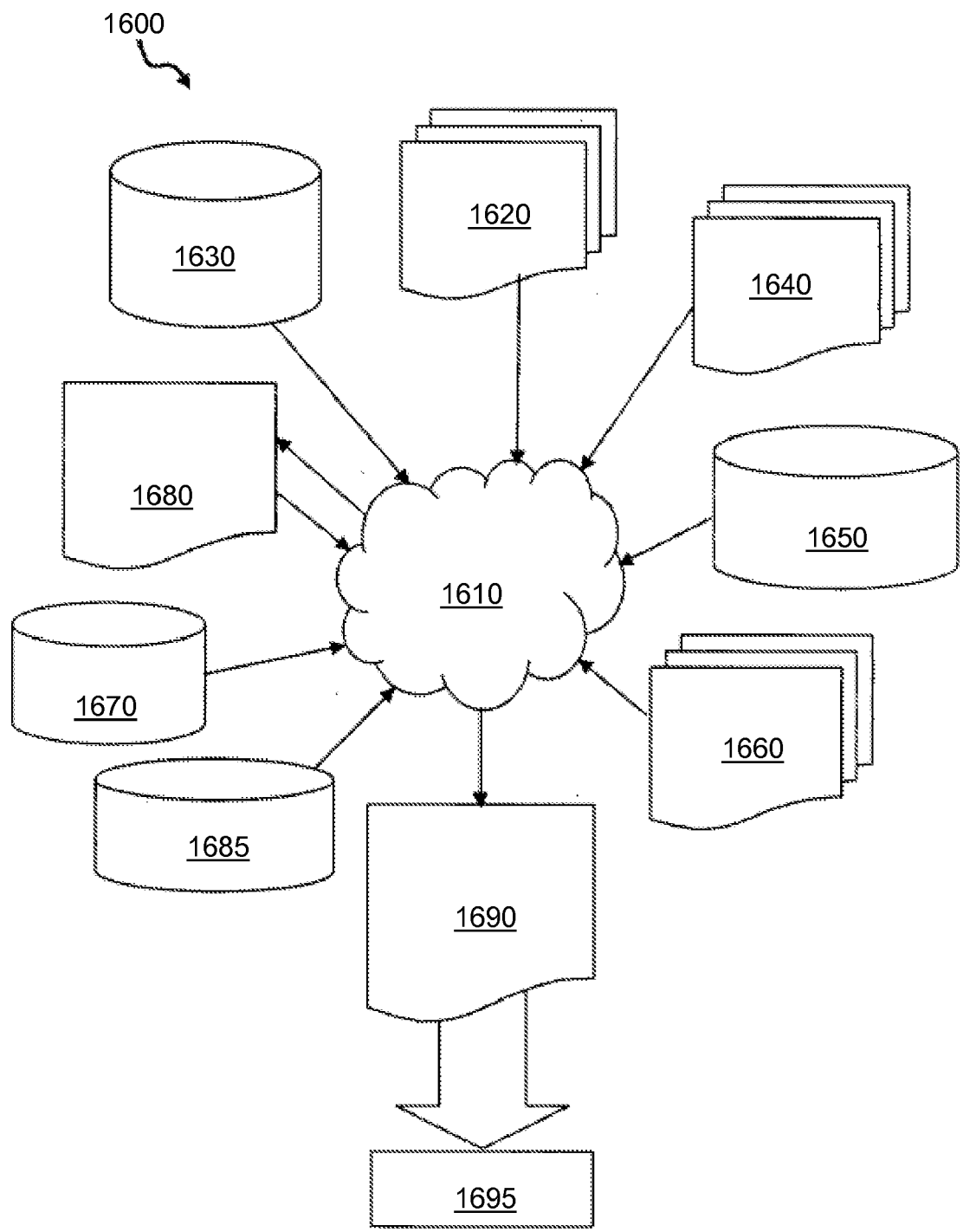

FIG. 9 shows a block diagram of an exemplary design flow 1600 used for example, in semiconductor IC logic design, simulation, test, layout, and manufacture. Design flow 1600 includes processes, machines and/or mechanisms for processing design structures or devices to generate logically or otherwise functionally equivalent representations of the design structures and/or devices described above and shown in FIGS. 1-8. The design structures processed and/or generated by design flow 1600 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include: lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 1600 may vary depending on the type of representation being designed. For example, a design flow 1600 for building an application specific IC (ASIC) may differ from a design flow 1600 for designing a standard component or from a design flow 1600 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 1620 that is preferably processed by a design process 1610. Design structure 1620 may be a logical simulation design structure generated and processed by design process 1610 to produce a logically equivalent functional representation of a hardware device. Design structure 1620 may also or alternatively comprise data and/or program instructions that when processed by design process 1610, generate a functional representation of the physical structure of a hardware device. Whether representing functional and/or structural design features, design structure 1620 may be generated using electronic computer-aided design (ECAD) such as implemented by a core developer/designer. When encoded on a machine-readable data transmission, gate array, or storage medium, design structure 1620 may be accessed and processed by one or more hardware and/or software modules within design process 1610 to simulate or otherwise functionally represent an electronic component, circuit, electronic or logic module, apparatus, device, or system such as those shown in FIGS. 1-8. As such, design structure 1620 may comprise files or other data structures including human and/ or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 1610 preferably employs and incorporates hardware and/or software modules for synthesizing, translating, or otherwise processing a design/simulation functional equivalent of the components, circuits, devices, or logic structures shown in FIGS. 1-8 to generate a Netlist 1680 which may contain design structures such as design structure 1620. Netlist 1680 may comprise, for example, compiled or otherwise processed data structures representing a list of wires, discrete components, logic gates, control circuits, I/O devices, models, etc. that describes the connections to other elements and circuits in an integrated circuit design. Netlist 1680 may be synthesized using an iterative process in which netlist 1680 is resynthesized one or more times depending on design specifications and parameters for the device. As with other design structure types described herein, netlist 1680 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 1610 may include using a variety of inputs; for example, inputs from library elements 1630 which may house a set of commonly used elements, circuits, and devices, including models, layouts, and symbolic representations, for a given manufacturing technology (e.g., different technology nodes, 32 nm, 45 nm, 90 nm, etc.), design specifications 1640, characterization data 1650, verification data 1660, design rules 1670, and test data files 1685 (which may include test patterns and other testing information). Design process 1610 may further include, for example, standard circuit design processes such as timing analysis, verification, design rule checking, place and route operations, etc. One of ordinary skill in the art of integrated circuit design can appreciate the extent of possible electronic design automation tools and applications used in design process 1610 without deviating from the scope and spirit of the invention. The design structure of the invention is not limited to any specific design flow.

Design process 1610 preferably translates an embodiment of the invention as shown in FIGS. 1-8, along with any additional integrated circuit design or data (if applicable), into a second design structure 1690. Design structure 1690 resides on a storage medium in a data format used for the exchange of layout data of integrated circuits (e.g. information stored in a GDSII (GDS2), GL1, OASIS, or any other suitable format for storing such design structures). Design structure 1690 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as described above with reference to FIGS. 1-8. Design structure 1690 may then proceed to a stage 1695 where, for example, design structure 1690: proceeds to tape-out, is released to manufacturing, is released to a mask house, is sent to another design house, is sent back to the customer, etc.

Although the invention has been shown and described with respect to a certain preferred embodiment or embodiments, certain equivalent alterations and modifications will occur to others skilled in the art upon the reading and understanding of this specification and the annexed drawings. In particular regard to the various functions performed by the above described components (assemblies, devices, circuits, etc.) the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary embodiments of the invention. In addition, while a particular feature of the invention may have been disclosed with respect to only one of several embodiments, such feature may be combined with one or more features of the other embodiments as may be desired and advantageous for any given or particular application.

What is claimed is:

1. A logic circuit comprising:
   an inequality register;
   a lower limit register;
   an upper limit register;
   a test data register;
   a test data out signal;
   a greater-than-or-equal compare logic block;
   a less-than compare logic block;
   wherein the inequality register comprises a plurality of bits that when programmed, enable an inequality evaluation comparing data in the test data register with data in the upper limit register and the lower limit register, and wherein the logic circuit is configured and disposed to cause the test data out signal to be asserted when data in the test data register satisfies an inequality condition.

2. The logic circuit of claim 1, further comprising:
   a lower limit mask register;
   an upper limit mask register;
   wherein the lower limit mask register is configured and disposed to mask the lower limit register and wherein the upper limit mask register is configured and disposed to mask the upper limit register.

3. The logic circuit of claim 1, further comprising a greater-than-or-equal compare logic block, the greater-than-or-equal compare logic block configurable to operate in signed arithmetic in response to programming a bit in the inequality register.

4. The logic circuit of claim 1, further comprising a greater-than-or-equal compare logic block, the greater-than-or-equal compare logic block configurable to operate in twos-complement arithmetic in response to programming a bit in the inequality register.

5. The logic circuit of claim 1, further comprising a less-than compare logic block, the less-than compare logic block configurable to operate in signed arithmetic in response to programming a bit in the inequality register.

6. The logic circuit of claim 1, further comprising a less-than compare logic block, the less-than compare logic block configurable to operate in twos-complement arithmetic in response to programming a bit in the inequality register.

7. The logic circuit of claim 1, wherein the inequality register comprises an activation bit.

8. The logic circuit of claim 7, wherein the inequality register further comprises three readable bits that contain status information for an inequality evaluation.

9. An integrated circuit chip comprising:
   at least one logic core;
   at least one inequality indication system;
   at least one test data out signal configured and disposed to output the results of the at least one inequality indication system; and
   wherein the at least one logic core comprises a plurality of logic cores, and each logic core of the plurality of logic cores comprises an inequality indication system.

10. The integrated circuit chip of claim 9, wherein the at least one test data out signal comprises a test data out signal for each logic core.

11. The integrated circuit chip of claim 9, further comprising:
    a JTAG test port;
    a combining module;
    a decoding logic block;
    wherein the combining module is configured and disposed to receive a signal from the inequality indication system of each logic core of the plurality of logic cores.

12. The integrated circuit chip of claim 9, comprising a single, chip-level inequality indication system configured and disposed to receive a test signal from the at least one logic core.

13. The integrated circuit chip of claim 9, comprising:
    a single, chip-level inequality indication system configured and disposed to receive data from one or more scan chains; and
    a test data out signal configured and disposed to convey the evaluation of an inequality of scan chain data by the chip-level inequality indication system.

14. A method for evaluating an inequality in a digital logic circuit, comprising:
    programming an inequality register;
    programming an upper limit register;
    programming a lower limit register; and
    programming a value to be compared in a test data register.

15. The method of claim 14, further comprising monitoring a test data out signal.

16. The method of claim 14, further comprising:
    programming a lower limit mask register; and
    programming an upper limit mask register.

17. The method of claim 14, further comprising:
    reading a plurality of bits of the inequality register to retrieve status information for an inequality evaluation.

18. The method of claim 14, further comprising:
    inputting data from a scan chain into a test data register;
    programming the inequality register to evaluate an inequality wherein the value of data in the test data register is less than the value in the upper limit register and the value of data in the test data register is greater than the value in the lower limit register.

19. The method of claim 18, wherein inputting data from a scan chain into a test data register comprises inputting an ambient temperature value.

* * * * *